United States Patent
Marso et al.

(10) Patent No.: US 6,689,633 B1
(45) Date of Patent: Feb. 10, 2004

(54) OPTICAL DETECTOR WITH A FILTER LAYER MADE OF POROUS SILICON AND METHOD FOR THE PRODUCTION THEREOF

(75) Inventors: Michel Marso, Jülich (DE); Rüdiger Arens-Fischer, Aachen (DE); Dirk Hunkel, Aachen (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 09/889,134

(22) PCT Filed: Dec. 24, 1999

(86) PCT No.: PCT/DE99/04096

§ 371 (c)(1),
(2), (4) Date: Sep. 24, 2001

(87) PCT Pub. No.: WO00/41456

PCT Pub. Date: Jul. 20, 2000

(30) Foreign Application Priority Data

Jan. 12, 1999 (DE) .......................................... 199 00 879

(51) Int. Cl.$^7$ .............................................. H01L 21/00
(52) U.S. Cl. ............................. 438/69; 438/71; 438/66; 438/87; 438/960
(58) Field of Search ............................... 438/65, 66, 69, 438/71, 72, 77–81, 87, 960, 710, 717, 719

(56) References Cited

U.S. PATENT DOCUMENTS

| | | | |
|---|---|---|---|
| 5,043,571 A | | 8/1991 | Hasegawa |
| 5,567,954 A | * | 10/1996 | Dobson et al. ................ 257/3 |
| 5,685,969 A | * | 11/1997 | Hoenig et al. ............. 205/123 |
| 5,696,629 A | | 12/1997 | Berger et al. |
| 5,939,732 A | * | 8/1999 | Kurtz et al. .................. 257/77 |
| 6,130,748 A | | 10/2000 | Krüger et al. |
| 6,255,709 B1 | | 7/2001 | Marso et al. |
| 6,350,623 B1 | * | 2/2002 | Scherer et al. ................ 438/3 |

FOREIGN PATENT DOCUMENTS

DE 4444620 C * 1/1996

* cited by examiner

*Primary Examiner*—John F. Niebling
*Assistant Examiner*—Viktor Simkovic

(57) ABSTRACT

An optical silicon-based detector with a porous filter layer that has a laterally modifiable filter effect, comprising a plurality of integrated photosensitive cells. The invention also relates to a method for the production of an optical detector by creating an insulating layer on the porous filter layer and by providing active filter surfaces.

16 Claims, 2 Drawing Sheets

A: After anodic etching
B: With insulating layer
C: After photo lithography
D: After etching

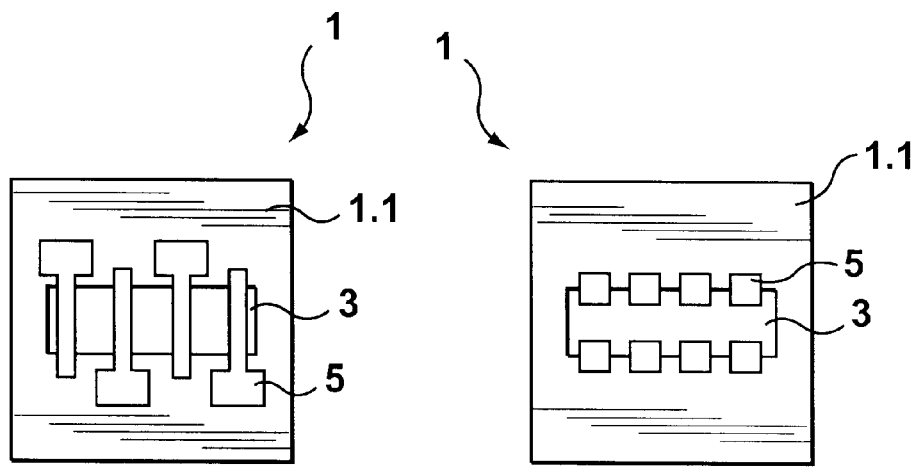
FIG. 1  FIG. 2
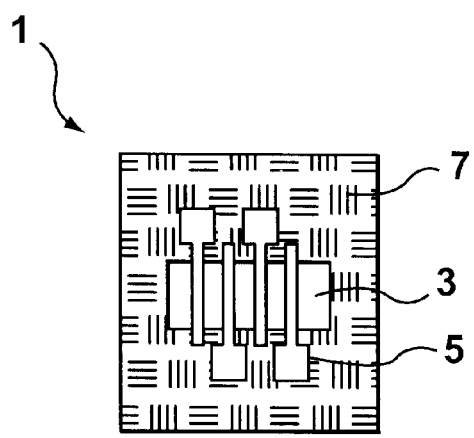
FIG. 3

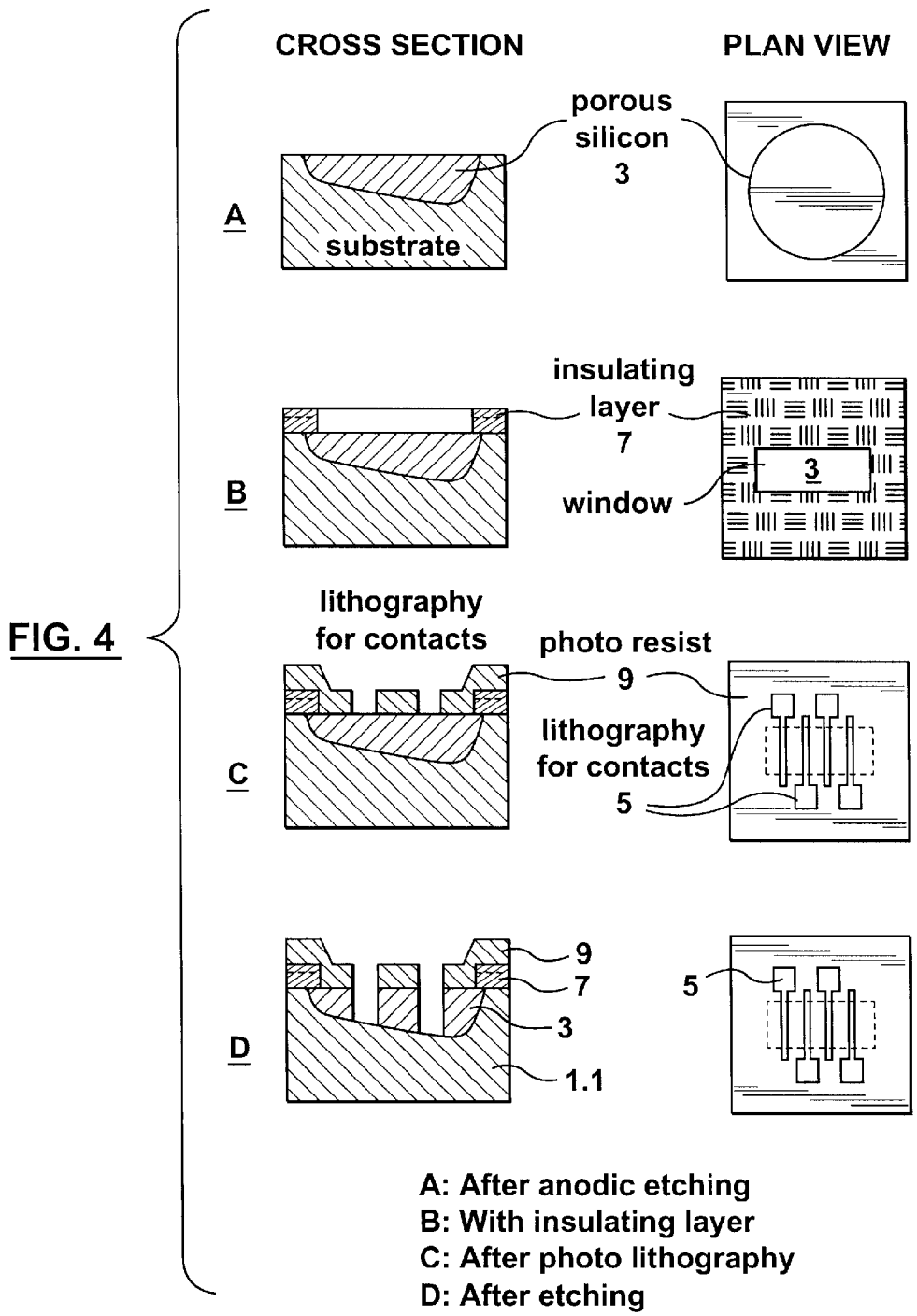

OPTICAL DETECTOR WITH A FILTER LAYER MADE OF POROUS SILICON AND METHOD FOR THE PRODUCTION THEREOF

FIELD OF THE INVENTION

The present invention relates to an optical detector with a filter layer of porous silicon, with a laterally modifiable filter effect as defined in the introduction to Patent claim 1, and to a method for manufacturing such an optical detector, as defined in the introduction to Patent claim 9.

BACKGROUND

Many methods for the spectral dispersion of light are known. Examples of such methods are refraction through a prism, diffraction in a linear lattice, or wavelength-dependent reflection or transmission on dielectric filter layers (e.g., Bragg reflector, Fabry-Perot filter). A simple and cost-effective method for manufacturing dielectric filters is to generate super-lattices of porous silicon. At The same time, as a starting material, silicon offers the possibility of generating photoreceptors (e.g., photoresistors, photodiodes).

To the extent that semiconductor-based photodetectors, the use of superlattices of porous silicon, and the production of lateral process filters are known, up to now all known detectors entail the disadvantage that they can hardly be modified. Using the methods that are known, it is only possible to manufacture detectors that can be used in a range of wavelengths that is established by this process. In addition, the complete filter layer is not used for detection, or the individual wavelength ranges cannot be completely decoupled from each other.

For this reason, it is the objective of the present invention to create an optical detector that can be manufactured in a simple and cost-effective way, and that is modifiable. In addition, it is intended to describe a manufacturing method for such an optical detector, with which the filter properties, i.e., the variability of the detector, can be adjusted in a simple manner.

SUMMARY

According to the present invention, this objective has been achieved by an optical detector with the distinguishing features set out in Patent claim 1, and by a manufacturing method having the distinguishing features set out in Patent claim 9.

Contact surfaces and active filter regions can be predetermined by the integrated configuration, using lithography only once.

According to claim 2, it is an advantage that the contacts are arranged transversely to the filter layer, since individual detectors that are adjacent to each other can be almost completely decoupled from each other by so doing, although the filter area is reduced if this is done.

According to claim 3, in order to obtain a large filter area, it is an advantage that the contacts are attached at the sides of the filter layer. Because of this, the whole of the filter layer can be used for detection, although the individual wavelength ranges cannot be completely decoupled from each other if this is done.

Additional advantages of the present invention are set out in the secondary claims 1 to 8 and 11 to 16.

BRIEF DESCRIPTION OF THE DRAWINGS

Embodiments of the present invention are described in greater detail below on the basis of the drawings appended hereto. These drawings show the following:

FIG. 1: a diagrammatic plan view of an optical detector with a first contact geometry for optimal decoupling;

FIG. 2: a diagrammatic plan view of a detector with a second contact geometry for optimal area utilization;

FIG. 3: a diagrammatic plan view of a spectroscope with an optical detector according to the present invention;

FIGS. 4a, b, c, d; a diagrammatic view of a production stage in cross section and a plan view of the manufacturing process.

DETAILED DESCRIPTION

FIG. 1 shows a plan view of an optical detector 1 with a substrate 1.1 and contacts 5 of porous silicon that are arranged transversely to a filter layer 3. By attaching the contacts 5 transversely to the filter layer 3, individual adjacent detectors 1 can be almost completely decoupled from each other, although this is done at the cost of part of the filter area of the filter layer 3.

FIG. 2 is a diagrammatic plan view of the optical detector 1, with optimal area utilization. In this embodiment, the contacts 5 are arranged at the sides of the filter layer 3, so that the whole of the filter layer 3 is used for detection, although the individual wavelength ranges cannot be entirely decoupled from each other.

In principle, the use of a few contacts 5 results in a detector 1 or a group of detectors 1 with a wide wavelength range (e.g., for a three-colour sensor). In contrast to this, many contacts (5) results in a detector 1 or a group of detectors 1 with more sharply defined spectral dispersions The contacts 5 can be formed as resistive contacts and then form photodetectors in the form of photoresistors, with the photoresistors' inherent internal amplification, although with relatively large dark currents. For this reason, the contacts 5 can be configured as Schottky contacts, which greatly decreases the dark currents. Then, however, there is no internal amplification, so that the doping of the silicon has to be very low, in order that a space charge zone of the Schottky contacts essentially extends beneath the filter layer 3. If the silicon is counter-doped prior to metallization of the contacts 5, it is also possible to form pn-transitions, e.g., to fiercer reduce the dark currents.

The dark current of the optical detector 1 with photoresistors according to the present invention can also be reduced if the thickness of the photoresistant layer (substrate 1.1) is kept as small as possible. This can be done, for instance, during production with amorphous silicon or poly-silicon by selecting the most resistive carrier material (substrate) possible and highly resistive, thin silicon layers (filter layers). The most resistive material should also be used in the case of monocrystalline silicon. A thin photoresistant layer can be achieved by using very thin wafers or by using an insulation layer stratum in the interior of the wafer. SiO2 (SIMOX or BESOI), for example, or a pn-transition can be used as an insulating layer.

FIG. 3 is a diagrammatic plan view of a finished spectroscope having a contact geometry as in FIG. 1, with an insulating layer 7.

The optical detector 1, or a dielectric filter such as this, is manufactured from porous silicon by anodic etching. The location-dependent spectral sensitivity is generated by applying a transverse current during the etching process.

Next, the porous silicon is etched off at certain, predetermined locations. The resistive contacts 5 or the Schottky contacts 5 are attached at these locations. Suitable arrangement of the contacts 5 results in photoresistors or metal-semiconductor-metal (MSM) diodes in which the non-porosidized silicon beneath the porous filter layer 3 serves as a photosensitive layer. Because of the location-dependent spectral transmission of the filter, there will also be location-dependent photosensitivity of the photodetectors.

In the manufacturing process according to the present invention, a filter structure or a layer of amorphous or polycrystalline silicon (FIG. 4a) is first generated by anodic etching of a disk of monocrystalline silicon 1.1. A location-dependent filter effect results from impressing an additional current along the surface.

Next, the insulating layer 7 (for example, SiO2, Si3N4, polyimide, plastic foil, and the like) is applied to the sample. When thins is done, a strip in the middle is left free, and this subsequently serves as the filter layer 3 (FIG. 4b) The insulating layer 7 can applied, for example, in an evaporator or sputterer, with structuring being effected by means of a shadow mask (not shown herein).

After this, the photosensitive resist is applied to the sample. In order to prevent the photo-resist penetrating into the pores of the porous silicon of the filter layer 3, a protective layer, of titanium, for example, (not show herein) can first be applied The photoresist 9 is illuminated with the structures of the future contacts 5 The photoresist is developed (FIG. 4c).

Then, the porous silicon of the filter layer 3 is etched, for example, by REACTIVE IONIC ETCHING), with the photoresist 9 as a mask. The protective layer (not shown herein) is etched at the same time, and the insulating layer 7 that was previously applied is not attacked, or is only partially attacked (FIG. 4d).

The contact material is then applied. The photoresist and the contact material lying upon it is removed (lift-off method). The protective layer (not shown herein) is etched off. The result is the optical detector I as a finished spectroscope, as in FIG. 3.

The method according to the present invention entails the advantage that lithography is needed only once. In addition, the contact material is applied only to the etched areas, such that it is self-adjusting. Regions from the centre of the layer produced from porous silicon can be used as active filter regions, which is to say that in contrast to other methods, random zones with undesirable edge effects can be avoided.

The essential features of the object of the present invention will be described below once again in summary form:

1. Optical detector 1 based on silicon, which consists of a plurality of photodetectors beneath a filter layer 3 that is of porous silicon, and which has a location-dependent filter effect.

2. Optical detector 1, in which the silicon is monocrystalline, polycrystalline, or amorphous.

3. Optical detector 1, in which the location-dependent filter effect is generated during production of the porous silicon of the filter layer 3 by an additional current through the silicon, transverse to the etching current or generally by non-uniform etching current.

4. Optical detector 1, in which the location-dependent filter effect is generated by a suitable shape of the etching cell or of an etching mask on the silicon.

5. Optical detector 1, in which the photodetectors are designed as photoresistors or as metal-semiconductor-metal diodes or a p-n-p (or n-p-n) diodes or from combinations thereof, and in which photodetection takes place essentially in the material beneath the filter layer 3.

6. Optical detector 1, in which the size and shape of the individual contacts 5 and the filter areas are so designed that a desired spectral sensitivity behaviour of the individual detectors is achieved.

7. Manufacturing method for an optical detector 1, in which a sample that is of amorphous or polycrystalline or monocrystalline silicon with or without an insulating intermediate layer 7 and a filter layer 3 is manufactured from porous silicon with a location-dependent filter effect. This location-dependent spectral filter effect can be achieved during or after the etching process by a non-uniform etching-current density, eg., by impressing a transverse current or by a suitably shaped etching surface, or non-uniform illumination.

8. Manufacturing method for an optical detector 1, in which—after production of the porous filter layer 3—this layer is covered by an insulating layer 7. The subsequent active filter layer 7 is freed of the insulating layer 7 or else is not even covered by this (e.g., by using a disk mask).

9. Manufacturing method for an optical detector 1, in which—after application of the insulating layer 7—the surface is covered with a layer of photoresist 9 and possibly an underlying protective layer, e.g, of titanium. Next, the contact surfaces are defined by photolithography, and the photoresist 9 is etched away at these locations. The remaining photoresist 9 serves as a mask for subsequent etching. As an alternative, every other method for applying an etching mask (for example, by cementing on a foil, by screen printing, and the like) can be used.

10. Manufacturing method for an optical detector 1, in which the porous silicon of the filter layer 3 is etched off through the etching mask of photoresist 9 (or another material), by wet or dry chemical methods (e.g., by reactive ionic etching), or by sputtering. When this is done, to the point that it is not protected by the etching mask, the insulation layer 7 is etched off either partially or not at all.

11. Manufacturing method for an optical detector 1, in which after being etched, the sample is metallized. After metallization, the etching mask is removed, so that the metal that has been applied is structured by lift-off. Because of this method, lithography is needed only once and the contacts are attached only to the porous-silicon locations in such a manner as to be self-adjusting. The metal surfaces on the insulating layer can be used as bonding and contact surfaces. The insulating layer 7 protects the underlying porous silicon layers of the filter layer 3 against the etching process, and serves as mechanical protection during bonding; on the other hand, major leakage currents will be avoided during bonding on the non-porosidized material. Because of the insulating layer 7, the active detector areas can be positioned in regions with a defined filter, and edge regions can be avoided during production of the porous silicon. The contacts 5 can be modified by ion implantation prior to metallizing, with the use of the etching mask as an implantation mask. Contact resistances can be reduced by increasing the doping; pn-transitions can be generated by counter-doping.

12. Manufacturing method for an optical detector 1, in which the contacts 5 are situated at the edges of the porous filter. This leaves the whole of the filter area free, although this will mean that adjacent detectors will be overspoken to a certain extent.

13. Manufacturing method for an optical detector 1, in which the contacts 5 run from an insulating layer 7 transversely through the filter layer 3 as far as the other insulating layer 7. Because of this, to a very large extent, the adjacent, individual detectors 1 will not be affected, although at the cost of part of the filter area.

We claim:

1. An optical detector comprising:
   a filter layer of porous silicon that exhibits a location-dependent spectral sensitivity along its surface; and
   a plurality of photoreceptor-contacts arranged across the filter layer in such a manner that adjacent detection regions of the filter layer are substantially decoupled from each other.

2. Optical detector as defined in claim 1, characterized in that the number of photoreceptor-contacts is a function of a wavelength range that is to be dispersed.

3. Optical detector as defined in claim 2, characterized in that the photoreceptor-contacts are resistive contacts.

4. Optical detector as defined in claim 2, characterized in that the photoreceptor-contacts are Schottky contacts.

5. Optical detector as defined in claim 4, characterized in that the photoreceptor-contacts are formed above the filter layer and transversely to the laterally modifiable filter effect of the active filter region.

6. Optical detector as defined in claim 4, characterized in that the photoreceptor-contacts are formed at the edges of the filter layer.

7. A method for manufacturing an optical detector with a filter layer of porous silicon that exhibits a location-dependent spectral sensitivity along its surface, said method comprising arranging a plurality of photoreceptor-contacts across the filter layer in such a manner that adjacent detection regions of the filter layer are substantially decoupled from each other.

8. Method as defined in claim 7, characterized by
application of an insulating layer on the porous filter layer while keeping the active filter areas uncovered.

9. Method as defined in claim 8, characterized by
application of an insulating layer on the porous filter layer with subsequent uncovering of the active filter areas.

10. Method as defined in claim 9, characterized by
application of a photoresist layer on the insulating layer prior to uncovering the active filter areas;
subsequent definition of the contact areas by photolithography;
etching off the photoresist at the defined contact areas.

11. Method as defined in claim 10, characterized in that the filter layer of porous silicon is etched off by wet chemical or dry chemical means, or by sputtering.

12. Method as defined in claim 11, characterized in that the metal areas that are formed on the insulating layer are used as bonding and contact areas.

13. Method as defined in claim 12, characterized in that the contact areas are located at the edges of the filter layer.

14. Method as defined claim 12, characterized in that the contact areas are oriented so as to be transverse to the filter layer.

15. An optical detector comprising:
a filter layer of porous silicon that exhibits a location-dependent spectral sensitivity along its surface; and
a plurality of photoreceptor-contacts arranged at the sides of the filter layer in such a manner that the entire filter layer can be used as an active filter region for detection.

16. A method for manufacturing an optical detector with a filter layer of porous silicon that exhibits a location-dependent spectral sensitivity along its surface, said method comprising arranging a plurality of photoreceptor-contacts at the sides of the filter layer in such a manner that the entire filter layer can be used as an active filter region for detection.

* * * * *